United States Patent [19]

Matsuoka

[11] Patent Number: 4,921,430
[45] Date of Patent: May 1, 1990

[54] CONNECTOR FOR THE USE OF ELECTRONIC PARTS

[75] Inventor: Noriyuki Matsuoka, Tokyo, Japan

[73] Assignee: Yamaichi Electric Mfg. Co., Ltd., Tokyo, Japan

[21] Appl. No.: 406,829

[22] Filed: Sep. 13, 1989

Related U.S. Application Data

[63] Continuation of Ser. No. 200,375, May 31, 1988, abandoned.

[30] Foreign Application Priority Data

Jun. 26, 1987 [JP] Japan .................... 62-159070

[51] Int. Cl.$^5$ ............................................. H01R 9/09
[52] U.S. Cl. ........................................ 439/72; 439/86; 439/886; 439/931
[58] Field of Search .................... 439/72, 85–87, 439/90, 91, 629, 931, 886

[56] References Cited

U.S. PATENT DOCUMENTS

| | | | |
|---|---|---|---|
| 4,008,300 | 2/1977 | Ponn | 439/86 |
| 4,027,936 | 6/1977 | Nemato et al. | 439/91 |
| 4,408,814 | 10/1983 | Takashi et al. | 439/91 |
| 4,577,922 | 3/1986 | Stipanuk et al. | 439/629 |
| 4,662,702 | 5/1987 | Furuya | 439/886 |
| 4,758,176 | 7/1988 | Abe et al. | 439/72 |
| 4,824,389 | 5/1989 | Doyle et al. | 439/72 |
| 4,838,799 | 6/1989 | Tonooka | 439/86 |

Primary Examiner—P. Austin Bradley
Attorney, Agent, or Firm—Wenderoth, Lind & Ponack

[57] ABSTRACT

A connector for electronic parts has a plurality of electronic contacting pieces arranged on a connector body at very narrow spaces and in parallel relation with respect to one another. Each of the electric contacting pieces is provided with an insulation material attached on its outer surface facing an adjacent electric contacting piece, so that the insulation material will act to isolate adjacent electric contacting pieces. The electric contacting pieces are thus planted in the connector body without any other insulating substance than the insulation material disposed between the adjacent electric contacting pieces.

15 Claims, 7 Drawing Sheets

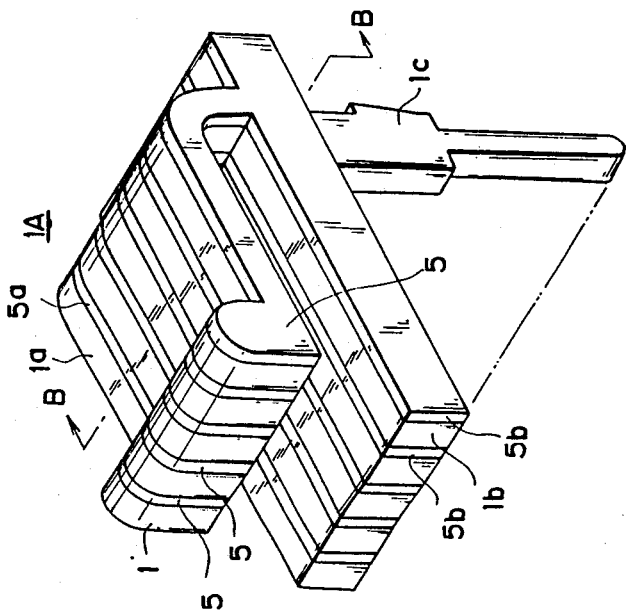
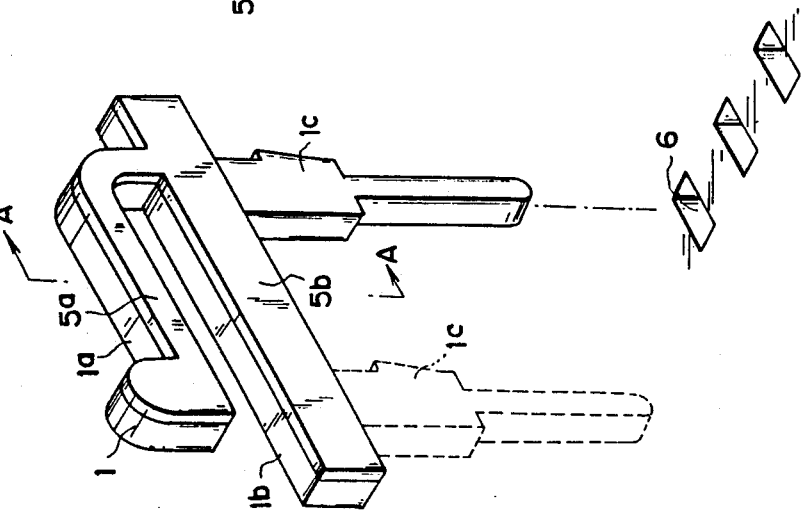

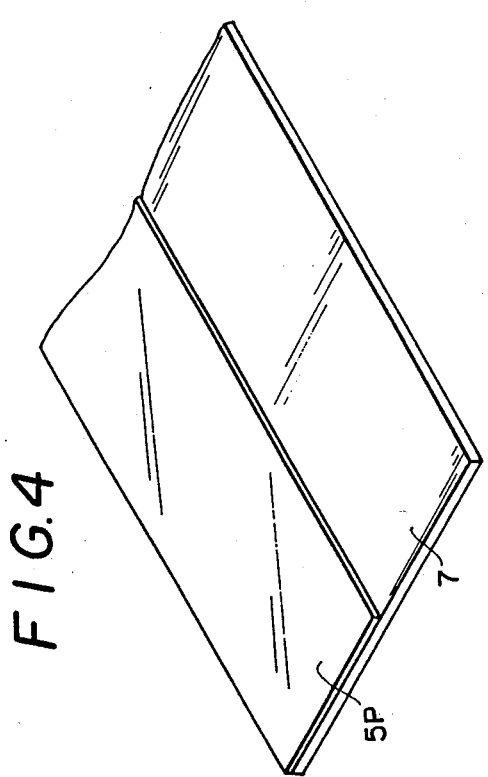
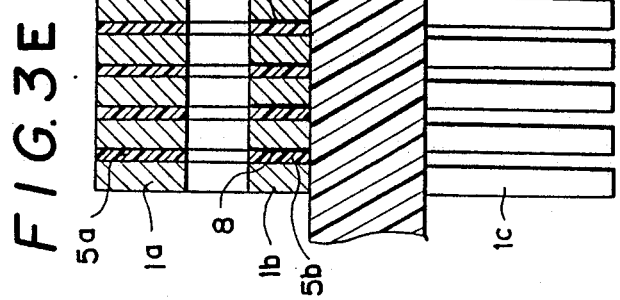
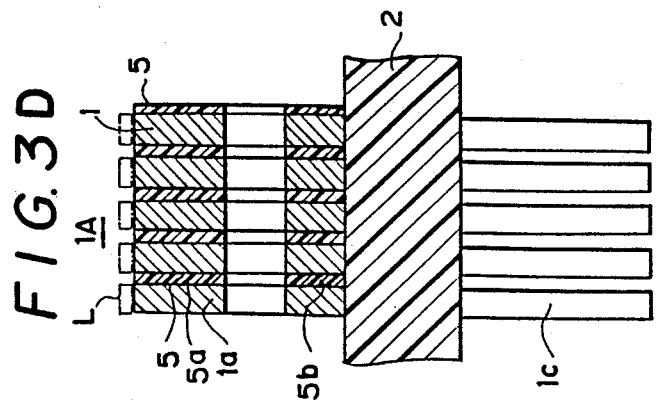

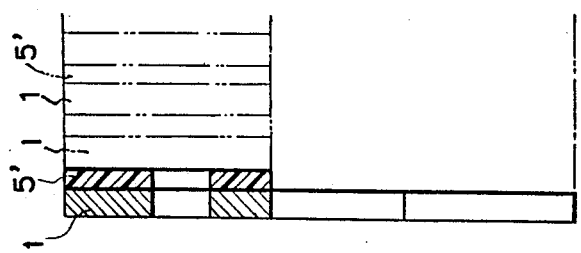
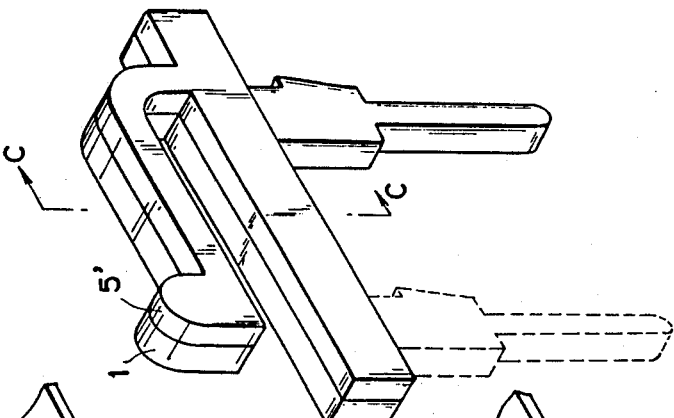
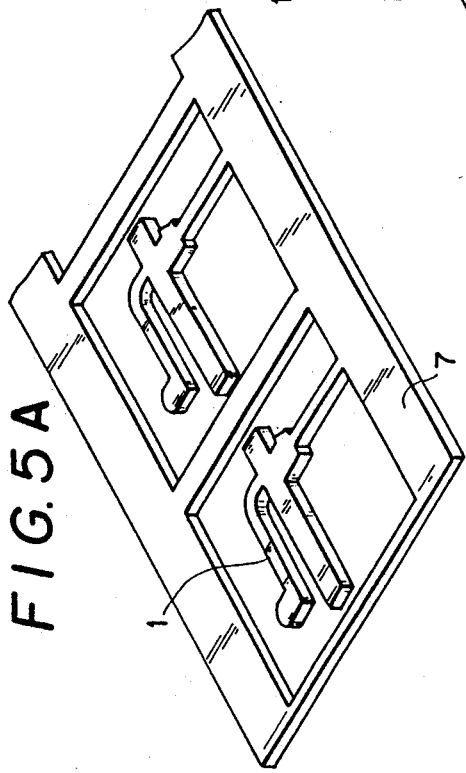
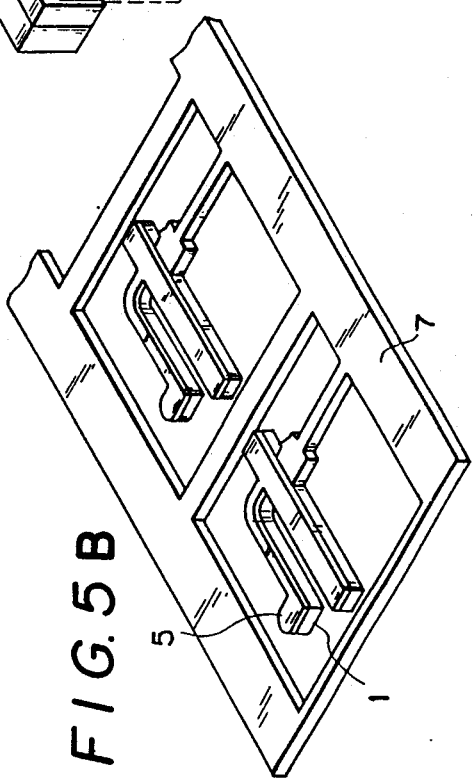

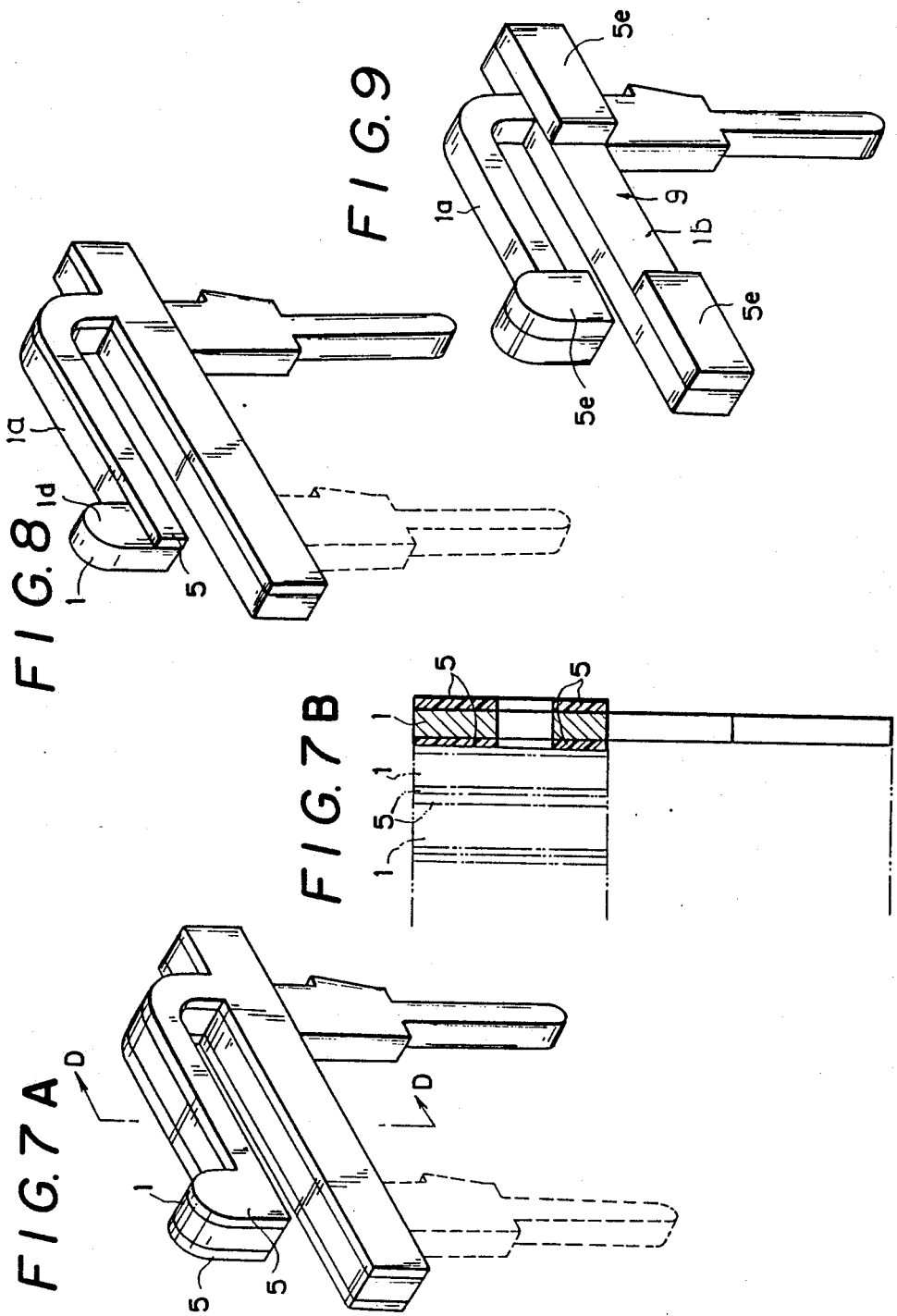

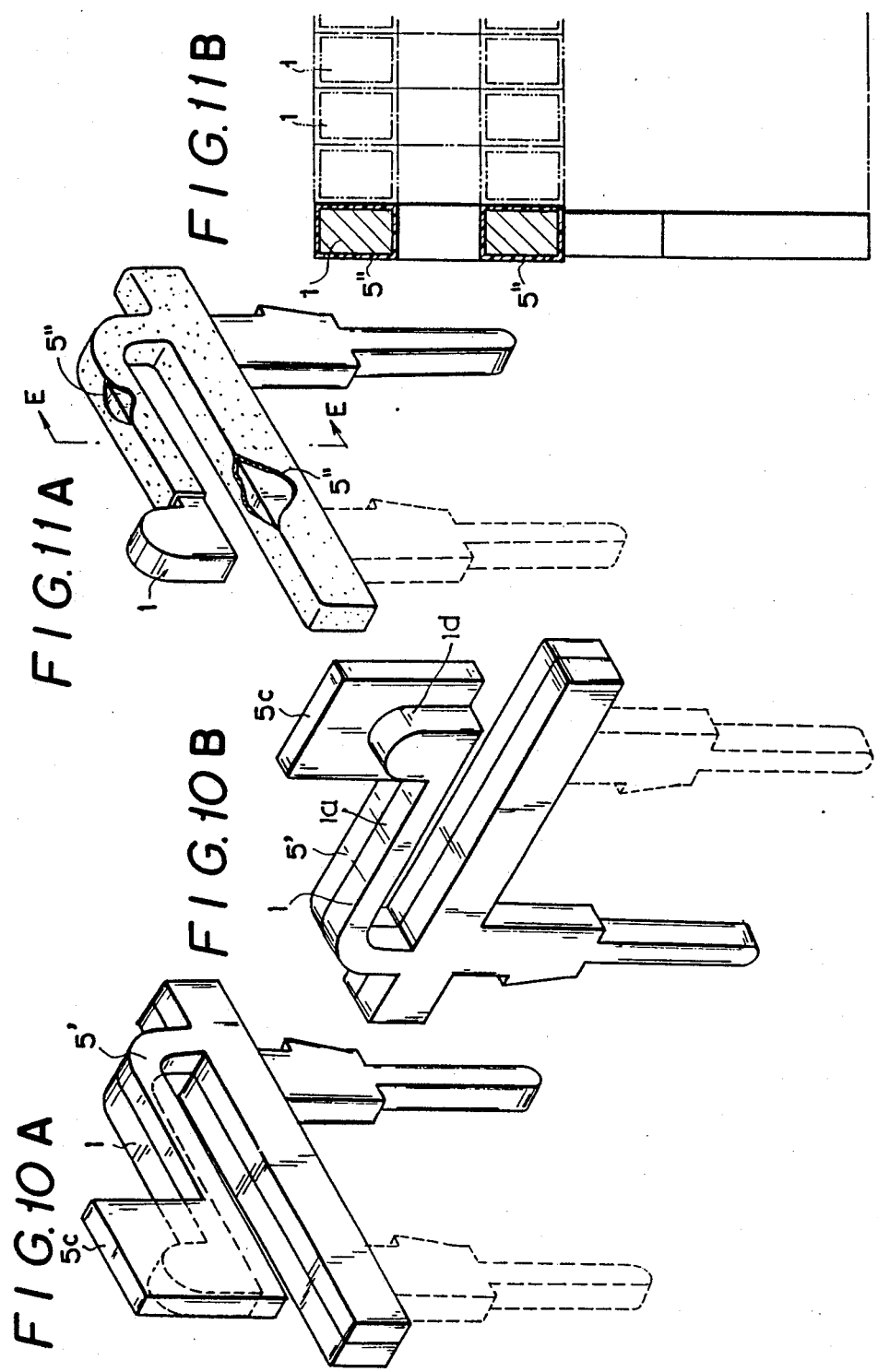

CONNECTOR FOR THE USE OF ELECTRONIC PARTS

This application is a continuation of now abandoned application, Ser. No. 200,375 filed on May 31, 1988.

BACKGROUND OF THE INVENTION

1. Field of the Invention

This invention relates to a connector for the use of electronic parts such as IC sockets in which a number of electronic contacting pieces must be arranged in high density and in parallel relation.

2. Description of the Prior Art

Heretofore, in the case where a number of electronic contacting pieces are to be arranged in high density and in parallel relation on a connector, the electronic contacting pieces are electrically isolated with respect to one another by a molded portion of the connector body forming an insulation body. For example, a plurality of accommodation chambers are defined in a connector body and adapted to accommodate a plurality of electric contacting pieces therein, a plurality of partition walls partitioning the accommodation chambers, the plurality of partition walls also adapted to isolate the electric contacting pieces from one another. Otherwise, a connector body may have an electric contacting piece planting body and a cover member with a plurality of holes formed therein, the electric contacting pieces, when the cover member is placed on the planting body, being accommodated in the plurality of holes formed in the cover member, the contacting pieces being isolated from one another by partition walls of the respective holes.

In an IC socket, as shown in FIG. 1 and FIGS. 2(A) through 2(C), a plurality of thin partition walls 3 are disposed in parallel relation with respect to one another around an IC accommodation space of a connector body 2 and a plurality of electric contacting pieces 1 are held in slits 4 formed between adjacent partition walls 3 so that the electric contacting pieces are isolated from one another.

For example, in an IC package with leads as contacting point elements projecting sideward in parallel relation with respect to one another or in an IC package, etc. with conductive pieces as contacting point elements intimately attached to the outer surface of the insulation portion of the IC body, an electric contacting piece 1 having a vertically resiliently displacable contacting piece 1a, as exemplified in FIG. 2(A), is used in the IC socket. A resilient contacting point element L of the IC package is placed on the free end of the resilient contacting piece 1a and a pressure cover 2a is closed thereon to cause the electric contacting piece 1 to be resiliently displaced downward against the resilient force and resiliently contacted with the contacting point by its restoring force, and then locked and held by a lock member 2b engagable with the cover 2a.

The electric contacting piece 1 is planted in the bottom wall of a slit 4 formed between the partition walls 3 through a leg piece 1c connected to the resilient contacting piece 1a. The end portion of the leg piece 1c is projected downward so as to act as a connecting terminal for contacting with a wire board or the like. The connecting portion between the resilient contacting piece 1a and the leg piece 1c in the afore-mentioned planted state, is a supporting piece 1b laid along the bottom wall surface of the slit 4. The displacement of the electric contacting piece 1 is prevented, and the contacting point element L is stabilized with respect to the pressure contact.

As described in the foregoing, in the conventional connector for the use of electronic parts the connector is integrally formed with partition walls, to thereby isolate the electric contacting pieces from one another.

However, the electric contacting pieces of the connector for the use of electric parts are very tiny and the arranging pitch is also very small. Therefore, the partition walls are required to be formed very thin, and the molding technique for making the partition walls very thin already reaches the limit.

For example, the least pitch of a contacting point element of an IC package now in use is 0.65 mm pitch. If the isolation is to be achieved by the molded partition wall 3 and slit 4 as in the case of the conventional IC socket, and if the thickness of the electric contacting piece 1 is made as thin as 0.3 mm which is the thinnest available at present, and if the width of the slit is made 0.35 mm, taking play into consideration, the thickness of the partition wall 3 becomes as thin as 0.3 mm. If the partition wall 3 is as thin as 0.3 mm, resin does not sufficiently flow into the slit molding portion during the molding, or the molding fin is deformed by inflow pressure. As a result, inferior molding products are produced in which the end portions of the partition wall 3 are often broken or fell.

In the IC package, there is a tendency toward making the contacting point element much narrower and smaller in the future. Therefore, some effective countermeasures are required to be worked out rapidly as a common problem of a connector for the use of electronic parts.

SUMMARY OF THE PRESENT INVENTION

It is therefore an object of the present invention to provide a connector for the use of electronic parts in which an electric contacting piece itself has a surface insulation material corresponding to the conventional molding partition wall so that the surface insulation material will act to isolate electric contacting pieces.

Another important object of the present invention is to provide a connector for the use of electronic parts in which electric contacting pieces can be arranged in much higher density compared with the conventional connector in which the molding partition wall is used as an isolator.

A further object of the present invention is to provide a connector for the use of electronic parts which is extremely simple in structure.

To achieve the above objects, in the present invention, contacting pieces are isolated from one another without using partition walls and by planting the electric contacting pieces in a connector body with no partition wall formed thereon. Each of the electric contacting pieces are arranged on the connector body at narrow spaces and in parallel relation and are provided with a surface insulation material for electrically isolating the electric contacting pieces from one another. By intimately arranging the electric contacting pieces with respect to one another in parallel relation through the surface insulation material, the surface insulation material functions as an isolator which takes the place of the conventional molding partition wall. The electric contacting pieces are planted in the connector body without any insulation material other than the surface insulation material.

As one embodiment, by attaching the electric contacting pieces at the surfaces thereof where outer surface insulation materials are intimately attached, a unit block electric contacting piece group is formed, to thereby facilitate the afore-mentioned planting of the electric contacting pieces.

As described in the foregoing, in the present invention, the surface insulation material, which the electric contacting piece itself has, is used as electric isolator corresponding to the conventional molding partition wall, and the electric contacting piece groups are intimately arranged in parallel relation with respect to one another by interposing no insulation substance other than the surface insulation material between the adjacent electric contacting pieces. As a result, the connector body is no longer required to be provided with the partition wall as in the case of the conventional connector, and the connector body may be provided with only planting holes in order to isolate the electric contact pieces from one another. In addition, a high density planting of the electric contacting pieces, which was difficult to attain when the molding partition wall acted as the isolator, can be obtained with the formation of an integral isolator. Therefore, the afore-mentioned problems involved in the prior art, such as breakage of the partition wall and the falling thereof due to the presence of the molding partition wall and its formation, can be fundamentally solved.

For a better understanding of the present invention, together with other and further objects thereof, reference is made to the following description, taken in conjunction of with the accompanying drawings, while its scope will be pointed out in the appended claims.

BRIEF DESCRIPTION OF THE DRAWINGS

FIGS. 3(A) through 3(E) illustrate the first embodiment of the present invention, wherein:

FIG. 3(A) is a perspective view of an electric contacting piece;

FIG. 3(B) is a perspective view of an electric contacting piece group in which the contacting pieces are intimately gathered;

FIG. 3(C) is a sectional view taken along the line A—A of FIG. 3(A);

FIG. 3(D) is a sectional view taken along the line B—B of FIG. 3(B) in which the electric contacting piece is planted;

FIG. 3(E) is a sectional view in which the electric contacting piece group of FIG. 3(D) is arranged in unit group on an attaching material;

FIG. 4 and FIGS. 5(A) and 5(B) illustrate one manufacturing example of the electric contacting piece, wherein;

FIG. 4 is a perspective view of a strip member with an insulation material applied to its important portion;

FIG. 5(A) is a perspective view showing one state where the electric contacting piece is punched out of the strip member;

FIG. 5(B) is an illustration of an electric contacting piece obtained by being punched out of the strip member of FIG. 4 or obtained by attaching an insulation material after it is punched out of the strip member;

FIG. 6(A) is a perspective view of an electric contacting piece according to a second embodiment of the present invention;

FIG. 6(B) is a sectional view taken along the line C—C of FIG. 6(A);

FIG. 7(A) is a perspective view of an electric contacting piece according to a third embodiment of the present invention;

FIG. 7(B) is a sectional view taken along the line D—D of FIG. 7(A);

FIG. 8 is a perspective view of an electric contacting piece according to a fourth embodiment of the present invention;

FIG. 9 is a perspective view of an electric contacting piece according to a fifth embodiment of the present invention;

FIG. 10(A) is a perspective view of an electric contacting piece according to a sixth embodiment of the present invention;

FIG. 10(B) is a perspective view of FIG. 10(A) but when viewed from the other side;

FIG. 11(A) is a partly cut-away perspective view of an electric contacting piece according to a seventh embodiment of the present invention; and FIG. 11(B) is a sectional view taken along the line E—E of FIG. 11(A).

DETAILED DESCRIPTION OF THE EMBODIMENTS

Figure 1:
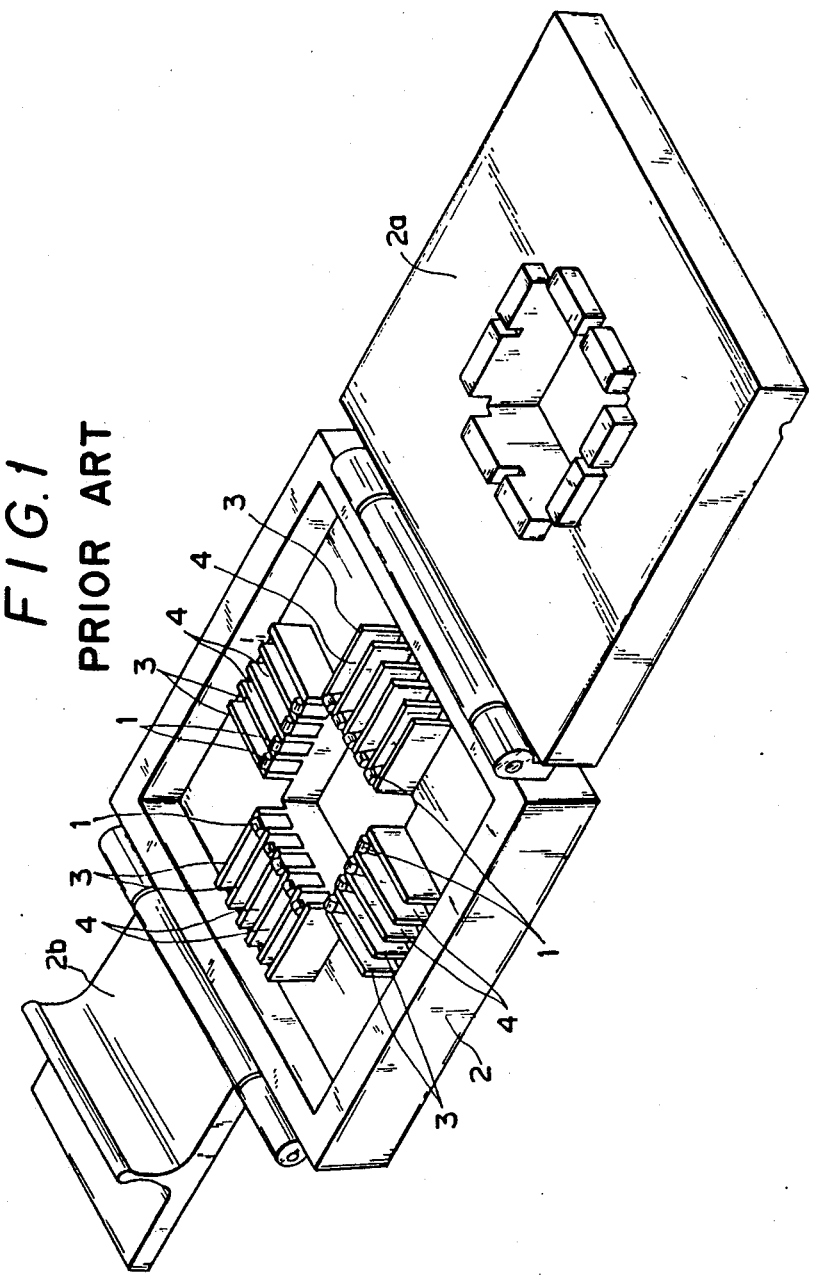
FIG. 1 is a perspective view showing a conventional connector.
Figure 2B:
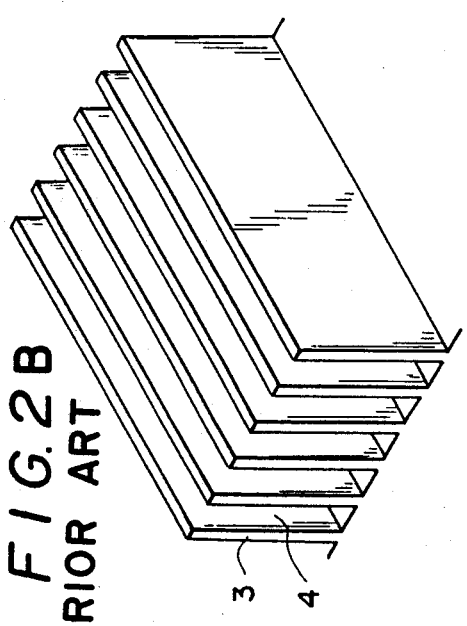
FIG. 2(B) is likewise a perspective view of a partition wall group of the connector of FIG. 1.
Figure 2C:
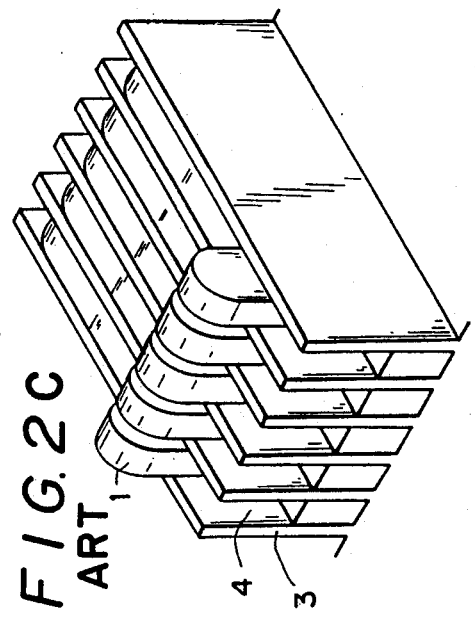
FIG. 2(C) is likewise a perspective view showing one state where the electric connecting piece group is planted in a slit group between the adjacent partition wall group of the connector of FIG. 1.
Figure 2A:
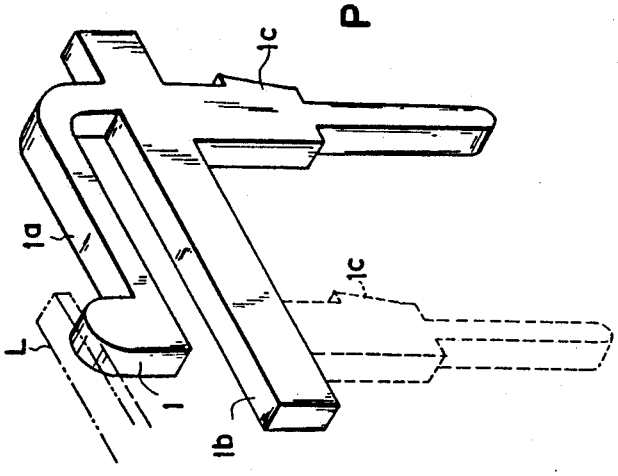
FIG. 2(A) is a perspective view of an electric contacting piece employed in the connector of FIG. 1.

A plurality of embodiments of the present invention will be described with reference to FIGS. 3 through 11. Each embodiment illustrates a contacting piece 1 used in the IC socket as a representative example. The contacting piece 1 has a vertically resiliently displacable resilient contacting piece 1a, a leg piece 1c for acting as a planting portion, and a supporting piece 1b continuously formed between the pieces 1a and 1c as described previously. The leg piece 1c, as shown in FIG. 3(A), is hung down from either one end or the other end of the supporting piece 1b.

The contacting piece 1, as shown in FIG. 5(A), is formed by being punched out of a metallic strip plate 7. Therefore, side surfaces of the respective portions of the contacting piece 1 are formed from the outer surface of the plate, and the remaining surfaces are formed from the surface of the plate thickness (punched-out surface). The surface of the plate thickness is used as a contacting surface with respect to a contacting point element L of the IC package. Therefore, the thickness of the plate becomes a restricting element of the pitch of a parallel arrangement.

In the first embodiment (see FIGS. 3(A) through 3(E)), the electric contacting piece 1 is attached to an insulation material 5 at its side surface, i.e., its one side surface facing an adjacent electric contacting piece. In the first embodiment, the outer surface insulation material 5 is applied only to one side surface of the resilient contacting piece 1a and that of the supporting piece 1b (see FIG. 3(A)). 5a denotes an outer surface insulation material of the resilient contacting pie and 5b denotes that of the supporting piece, respectively.

In order to manufacture the electric contacting piece 1, as shown for example in FIG. 4, an insulation material 5P is attached only to a necessary portion of the outer surface of the strip member 7 formed of a contacting point material, and then the strip member 7 is punched out. Otherwise, as shown in FIG. 5(A), a series of the electric contacting piece 1 is punched out of the strip member 7 and then each contacting piece 1 is attached to the insulation material.

In this way, a series of electric contacting pieces 1 each attached at its one side surface to the outer surface insulation material 5 can be obtained.

As one example, an insulation film as the insulation material 5 may be bonded to the strip member 7. Otherwise, the insulation material 5 may be formed by masking print or the like.

A predetermined number of such obtained electric contacting pieces 1, as shown in FIGS. 3(B) and 3(D), are intimately attached with one another through the outer surface insulation materials 5a, 5b, and planted in the connector body 2.

The electric contacting pieces 1, as shown as one example in FIG. 3(A), are press fitted into planting holes 6 formed in the connector body 2 one after another so as to form a group of intimately arranged electric contacting pieces 1, as described previously. In this case, the outer surface insulation material 5a, 5b of one of the adjacent electric contacting pieces 1 is intimately contacted at its free contacting surface with the outer surface of the parent material of the other electric contacting piece 1.

Otherwise, the group of the electric contacting pieces 1, as shown in FIG. 3, are arranged in the intimately attached state before they are planted, and then planted as one group as shown in FIG. 3(D). In order to use group planting, as shown in FIG. 3(E), the adjacent electric contacting pieces 1 are attached to each other by an material 8 through the outer surface attaching insulation material 5 to form a unit block 1A, as shown in FIG. 3(B), and this unit block 1A can be planted in the group of planting holes formed in the connector body 2 as one group, as shown in FIG. 3(E). Instead of the attaching material 8, the insulation material itself may be parent material welded.

In this case, it is preferable that the adjacent supporting pieces 1b of the electric contacting pieces 1 are attached with each other by the attaching material 8 as shown in FIG. 3(E), and the adjacent resilient contacting pieces 1a are allowed to have a free interface so that each resilient contacting pieces 1a can be freely resiliently displaced.

By the procedure of the first embodiment, a planting form of the electric contacting pieces 1 can be obtained in which the adjacent electric contacting pieces 1 are intimately attached with each other in parallel relation through the outer surface insulation material 5 which is attached to one side surface of each electric contacting piece 1. That is, the plurality of electric contacting pieces 1 can be planted in the connector body 2 by using the outer surface insulation material 5 attached to one side surface of each electric contacting piece 1 as a electric isolator to electrically isolate the electric contacting pieces 1. Therefore, the connector body 2 is merely provided with a plurality of planting holes 6 as shown in FIG. 3(A), and no partition wall for partitioning the electric contacting pieces 1 is required between the adjacent electric contacting pieces 1.

Next, in the second embodiment (see FIG. 6), an outer surface attaching insulation material 5' is formed of a plastic plate having a comparatively large rigidity. By attaching the plastic plate to one side surface of each of the electric contacting pieces 1 in the same manner as described in the first embodiment, the plastic plate is used as the electric isolator. By using the plastic plate as the electric isolator, a rigidity is given to the electric contacting piece 1.

That is due to a compound structure of a metal plate and a plastic plate, a required amount of rigidity is given to the electric contacting piece 1, and the metal plate portion of the electric contacting piece 1 can be made thin, due to the addition of rigidity by the plastic plate.

In the third embodiment (see FIGS. 7(A) and 7(B)), contrary to the first and the second embodiments in which the outer surface insulation material 5 is attached to one side surface of the electric contacting piece 1, the outer surface insulation material 5 is attached to both side surfaces of the electric contacting piece 1 to attain the intimately attached parallel relation arrangement of the electric contacting pieces 1. In the third embodiment, the outer surface insulation materials 5 are intimately attached with each other, and a multilayer of the outer surface attaching insulation materials 5 are interposed between the adjacent electric contacting pieces 1 and function as isolators. According to this embodiment, an electric contacting piece with the outer surface insulation material 5 attached thereto and an electric contacting piece with no outer surface insulation material 5 attached thereto may be alternately planted in intimately attached and parallel relation to attain the isolation.

In the third embodiment, the electric contacting piece group can also be made as a unit block 1A by attaching the adjacent electric contacting pieces through an adhesive agent in the same manner described with respect to FIG. 3(E), or welded by using the outer surface insulation materials as parent materials.

In the fourth embodiment (see FIG. 8), the insulation material 5 attached to the one side surface of the electric contacting piece 1 in the second embodiment or the insulation material 5 attached to the both side outer surfaces of the third embodiment is removed at the contacting portion 1d of the free end of the resilient contacting piece 1a. The contacting portion 1d is a place where the contacting point element L of the IC package is repeatedly placed and contacted. By this embodiment, the peeling-off of the outer surface attaching insulation material 5 can be effectively prevented at the contacting portion 1d when placed and contacted.

In the fifth embodiment (see FIG. 9), an outer surface insulation material 5 is disposed to important places of the electric contacting piece 1. Particularly, in the contacting piece structure of the socket for the use of the IC package, the outer surface attaching insulation material 5e is selectively attached to both ends of the supporting piece 1b, the free end of the resilient contacting piece 1a, and an intermediate portion is permitted to be in a parent material exposing state, forming a space forming portion 9.

In this embodiment, the insulation material 5 is employed at one side outer surface or both side outer surface of the electric contacting piece 1.

With the above structure, when the electric contacting pieces 1 are intimately attached in parallel relation as shown in FIG. 3(B), the outer surface insulation material 5e is intimately attached at the end portion of the electric contacting piece 1 where the outer surface attaching material 5e is most easily displaced, and a space of a predetermined dimension is formed between the adjacent electric contacting pieces 1 at a space forming portion 9 where the outer surface insulation material 5e is not present. That is, the adjacent electric contacting pieces 1 are air insulated with respect to each other by using the outer surface insulation material 5e as a spacer.

In the sixth embodiment (see FIGS. 10(A) and 10(B)), as in the second embodiment 2, a plastic plate having a rigidity, is used as the insulation material, and is attached to one side outer surface of the resilient contacting piece 1a of the electric contacting piece 1 and to one side outer surface of the supporting piece 1b, and an insulation material 5c is projected upward from one side outer surface of the contacting portion 1d of the resilient contacting piece 1a so that the insulation material 5c functions as a positioning piece for positioning the adjacent contacting point element L of the IC package.

When the electric contacting pieces 1, as shown in FIG. 3(B), are intimately attached in parallel relation, the insulation material 5c as the positioning piece are disposed to both sides of the contacting portion 1d, and the contacting point element L is restricted in its position on both sides thereof by the insulation material 5c, so as to correctly correspond to the contacting portion 1d.

In the seventh embodiment (see FIGS. 11 (A) and 11(B)), the electric contacting piece 1 is covered at its peripheral surface with an insulation material 5''.

In this case, the contacting portion 1d is permitted to be in its exposed state. In this embodiment, the insulation material 5'' can be firmly attached, and peeling-off and coming-off of the insulation material does not take place, and therefore, can be used as an isolator.

As described in the foregoing, according to the present invention, the electric contacting piece itself is provided with an outer surface insulation material corresponding to the molding partition wall of the conventional connector, and this outer surface attaching insulating material is used as means for isolating the adjacent electric contacting pieces. In this way, the electric contacting pieces are intimately attached in parallel relation without any insulating substance other than the outer surface attaching insulation material interposed between the adjacent electric contacting pieces. Accordingly, the connector body may be merely provided with planting holes, and no molding partition wall as seen in the prior art is required for isolating the contacting pieces. Moreover, the electric contacting pieces can be planted in a very high density as compared with the conventional connector in which the molding partition wall is used as an isolator. In addition, the electric isolation between the adjacent electric contacting pieces can be wholly maintained even if the electric contacting pieces are planted in very high density.

Furthermore, since the connector body is not required to be provided with a partition wall, all problems related to the provision of the partition wall and its formation, such as breakage of the partition wall, the falling thereof, or the like, can be completely solved. Therefore, the connector body can be made extremely simple in structure.

Although the present invention is illustrated and described with reference to a plurality of embodiments thereof, it is to be expressly understood that it is in no way limited to such preferred embodiments but is capable of numerous modifications within the scope of the appended claims.

What is claimed is:

1. A connector for connecting electronic devices, comprising:
   a connector body; and
   a plurality of electric contacts for arrangement in said connector body in parallel at relatively small intervals from each other, each said electric contact comprising:
   a supporting member;
   a resilient contact member cantilevered at one end thereof to said supporting member, said resilient contact member having a contact portion integral therewith on a free end thereof;
   a leg member extending from said supporting member;
   a first insulating material portion attached to one side surface of said supporting member; and
   a second insulating material portion attached to one side surface of said free end of said resilient contact member.

2. The connector as set forth in claim 1, wherein:
   said one side surface of said supporting member and said one side surface of said free end of said resilient contact member are on the same side of said electric contact.

3. The connector as set forth in claim 1, and further comprising:
   further insulating material portions attached to the side opposite said one side surface of, and at locations corresponding to, said first and second insulating material portions.

4. The connector as set forth in claim 1, wherein:
   said resilient contact member has a free and uncovered portion on said one side surface thereof between said first insulating material portion at said free end and the point whereat said resilient contact member is cantilevered to said supporting member at said one end.

5. The connector as set forth in claim 1, wherein:
   an adhesive attaches the respective insulating material portions to their respective side surfaces.

6. The connector as set forth in claim 1, wherein:
   said supporting member, resilient contact member and leg member of each electric contact are integral with each other and comprise metal stamped from a metal blank.

7. The connector as set forth in claim 1, and further comprising:
   a third insulating material portion attached to said one side surface of said supporting member, wherein said first and third insulating material portions are at opposite ends of said supporting member.

8. The connector as set forth in claim 1, and further comprising:
   further insulating material portions attached to the side opposite said one side surface of, and at locations corresponding to, said first, second and third insulating material portions.

9. An electric contact for use in a connector for connecting electronic devices, comprising:
   a supporting member;
   a resilient contact member cantilevered at one end thereof to said supporting member, said resilient contact member having a contact portion integral on a free end thereof;
   a leg member extending from said supporting member;

a first insulating material portion attached to one side surface of said supporting member; and a second insulating material portion attached to one side surface of said free end of said resilient contact member.

10. The electric contact member as set forth in claim 9, wherein:

said one side surface of said supporting member and said one side surface of said free end of said resilient contact member are on the same side of said electric contact.

11. The electric contact as set forth in claim 9, and further comprising:

further insulating material portions attached to the side opposite said one side surface of, and at locations corresponding to, said first and second insulating material portions.

12. The electric contact as set forth in claim 9, wherein:

said resilient contact member has a free and uncovered portion on said one side surface thereof between said first insulating material portion at said free end and the point whereat said resilient contact member is cantilevered to said supporting member at said one end.

13. The electric contact as set forth in claim 9, wherein:

an adhesive attaches the respective insulating material portions to their respective side surfaces.

14. The electric contact as set forth in claim 9, and further comprising:

a third insulating material portion attached to said one side surface of said supporting member, wherein said first and third insulating material portions are at opposite ends of said supporting member.

15. The electric contact as set forth in claim 14, and further comprising:

further insulating material portions attached to the side opposite said one side surface of, and at locations corresponding to, said first, second and third insulating material portions.

* * * * *